United States Patent [19]
Cadieu

[11] Patent Number: 5,982,177
[45] Date of Patent: Nov. 9, 1999

[54] MAGNETORESISTIVE SENSOR MAGNETICALLY BIASED IN A REGION SPACED FROM A SENSING REGION

[75] Inventor: Fred J. Cadieu, Great Neck, N.Y.

[73] Assignee: Florida State University, Tallahassee, Fla.

[21] Appl. No.: 08/907,793

[22] Filed: Aug. 8, 1997

[51] Int. Cl.[6] .............................. G11B 5/127; G11B 5/39; G01R 33/02; G01N 27/72

[52] U.S. Cl. ........................ 324/252; 324/235; 338/32 R; 360/113

[58] Field of Search .............................. 324/207.21, 252, 324/235; 338/32 R; 360/113

[56] References Cited

U.S. PATENT DOCUMENTS

| | | | |
|---|---|---|---|
| 3,967,368 | 7/1976 | Brock et al. ............................... | 29/603 |
| 4,321,641 | 3/1982 | Lee ........................................ | 360/126 |
| 4,362,767 | 12/1982 | Nouchi et al. ........................... | 427/130 |
| 4,639,806 | 1/1987 | Kira et al. ............................... | 360/113 |
| 4,809,109 | 2/1989 | Howard et al. .......................... | 360/113 |
| 4,841,235 | 6/1989 | Hastings et al. ..................... | 324/117 R |
| 5,018,037 | 5/1991 | Krounbi et al. ......................... | 360/113 |
| 5,068,606 | 11/1991 | Kawate et al. ........................... | 324/174 |
| 5,081,554 | 1/1992 | Das ........................................ | 360/113 |
| 5,085,935 | 2/1992 | Mallary .................................... | 428/336 |
| 5,089,066 | 2/1992 | Hamada et al. ......................... | 148/302 |
| 5,089,334 | 2/1992 | Mallary et al. .......................... | 428/336 |
| 5,095,397 | 3/1992 | Nagata et al. ........................... | 360/113 |
| 5,097,372 | 3/1992 | Fukazawa et al. ...................... | 360/113 |
| 5,190,599 | 3/1993 | Sahashi et al. .......................... | 148/315 |
| 5,212,611 | 5/1993 | Dee ........................................ | 360/113 |
| 5,286,712 | 2/1994 | Fujita et al. ............................. | 505/1 |
| 5,287,237 | 2/1994 | Kitada et al. ........................... | 360/113 |
| 5,344,669 | 9/1994 | Chen et al. .............................. | 427/130 |
| 5,428,491 | 6/1995 | Smith ...................................... | 360/113 |
| 5,473,490 | 12/1995 | Somers et al. .......................... | 360/113 |
| 5,479,308 | 12/1995 | Voegeli et al. .......................... | 360/113 |
| 5,483,735 | 1/1996 | Postma et al. ........................... | 29/603 |
| 5,493,464 | 2/1996 | Koshikawa .............................. | 360/113 |
| 5,600,238 | 2/1997 | Holloway et al. .................. | 324/207.21 |

*Primary Examiner*—Walter E. Snow
*Attorney, Agent, or Firm*—Senniger, Powers, Leavitt & Roedel

[57] ABSTRACT

A magnetic sensor for detecting the presence of a magnetic sample proximate a sensing region. A magnetoresistive element is positioned in a biasing region of the sensor which is spaced apart from the sensing region. A magnetic circuit provides a magnetic field to the sensing region and the biasing region. The magnetic field biases the magnetoresistive element positioned in the biasing region. A circuit detects changes in the magnetic field in the biasing region as a function of changes in the resistance of the magnetoresistive element whereby changes in the magnetic field caused by the presence of a magnetic sample proximate the sensing region are detected.

25 Claims, 4 Drawing Sheets

MAGNETORESISTIVE SENSOR MAGNETICALLY BIASED IN A REGION SPACED FROM A SENSING REGION

BACKGROUND OF THE INVENTION

The invention relates generally to magnetoresistive (MR) sensor materials and, particularly, to a thin film sensor which has a lanthanum-manganite (La—$MnO_3$) based magnetoresistive element and which generates highly uniform gap magnetic fields for biasing the element.

In general, "magnetoresistance" refers to a resistance change produced in a magnetic sample when it is subjected to a magnetic field. This phenomenon typically occurs in magnetic materials in which the electrical resistance of the material is dependent upon the direction of magnetization in the material relative to the direction of current flow. One such material is a magnetically soft alloy of metal known as permalloy (e.g., approximately 80 at. % Ni and 20 at. % Fe). Permalloy and like materials are often referred to as low field MR materials.

In low field MR materials, the resistance changes as a function of the magnetization and current directions in the material according to:

$$\rho(H) = \rho(0) + \Delta\rho_{max} \cdot \cos^2(\theta)$$

where $\theta$ is the angle between the direction of magnetization and the direction of current flow in the material; $\rho(0)$ is the isotropic resistivity; and $\Delta\rho_{max}$ is the change in $\rho$ for the angle between the magnetization and current directions being changed from 0° to 90° (i.e., $\Delta\rho_{max}$ is the maximum magnetoresistivity). Typically, $\Delta\rho_{max}$ is only a few percent of $\rho$.

In general, the anisotropy field, which is defined as the field required to change the direction of magnetization by 90°, is fairly small at relatively low field strengths (e.g., only several to approximately 100 oersted (Oe)). Anisotropy is the directional dependence of magnetic properties, leading to the existence of easy or preferred directions of magnetization. In other words, magnetic materials have a better magnetic characteristic along one axis than along any other. The changes in resistivity are nearly linear for $\theta \approx 45°$. Often, some combination of longitudinal and transverse biasing is used to offset the direction of the magnetization from that of the current direction to cause the magnetoresistive effect. One common biasing mode is a barber pole arrangement of conductors on the magnetoresistive surface to skew the current direction between these conductors away from the magnetoresistive longitudinal direction.

Magnetoresistive sensors use the characteristics of certain MR materials to detect magnetic field changes. One use for magnetoresistive sensors is reading information from magnetic recordings. Such a sensor, often referred to as a magnetoresistive read head, has current flowing in one end and out another. When the recording medium, which has a changing magnetization pattern due to the information stored on it, moves relative to the read head, the stray fields from the medium cause a change in the direction of magnetization. Thus, the resistance of the head changes. By using a constant current source to drive the head, the change in resistance can be measured by determining the change in voltage across the read head's terminals.

A disadvantage with low field magnetoresistive sensors is that the relative signal levels are usually small. In other words, sensitive circuits (e.g., bridge type circuits) are needed to detect the changes in resistance.

In contrast to low field MR materials, high field MR materials (e.g., La-manganite) exhibit little or no change in resistance due to directional changes in magnetic field. Rather, the resistance of a high field MR material changes upon application of a magnetic field primarily as a function of the applied field magnitude. The change occurs as the material essentially undergoes a metal-insulator transition when subjected to the magnetic field. Due to this transition, the changes in resistance levels are a greater percentage of the overall resistance in high field MR materials. Therefore, sensors using high field MR materials permit less complex electronics for detecting and processing resistance changes.

The use of high field MR materials as magnetoresistive sensors, however, differs from the traditional uses of MR materials in several respects. For example, since the magnetoresistance arises from a metal-insulator transition in La-manganite, the resistance change is very large but only occurs over a relatively narrow temperature range which defines the transition. Another difference is that there is no directional dependence of the resistance with respect to the current flow and magnetic field direction. And lastly, the magnetic fields required to bias the material for high magnetoresistive sensitivity are relatively large and much greater than those required in traditional magnetoresistive sensing elements. These differences present practical problems in implementing the sensors.

Therefore, a uniform biasing field provided by a small scale geometry is desired for practical operating reasons. Further, it is desired that such geometry be fabricated by film deposition methods and permit temperature isolation of the magnetoresistive element.

As stated above, presently available magnetoresistive sensors detect the presence of an externally applied magnetic field. In other words, such sensors detect the presence of a magnetized material such as a magnetic recording medium. For this reason, such sensors are not suited for a number of uses other than magnetic recording read heads such as position and/or rotation sensing, bar or dot code reading. Therefore, a magnetoresistive sensor is desired for detecting the presence of magnetized or magnetizable material, as opposed to magnetized material only.

SUMMARY OF THE INVENTION

Among the several objects of this invention may be noted the provision of a magnetoresistive sensor which applies a substantially uniform magnetic field over a relatively small magnetoresistive gap region for biasing the region; the provision such sensor which permits sensing remotely from the magnetoresistive element region; the provision of such sensor which permits magnetizing permanent magnet films with a single magnetic field application of relatively large spatial extent; the provision of such sensor which permits varying the level of the magnetic biasing field; the provision of such sensor which detects changes in the proximity of soft magnetic material to the sensor gap; the provision of such sensor which detects changes in the proximity of magnetically hard magnetized magnetic material to the sensor gap; the provision of such sensor which permits less sensitive circuitry for detecting magnetoresistive changes; the provision of such sensor permits maintaining the magnetoresistive element at a desired temperature; the provision of such sensor which permits film deposition manufacturing processes; the provision of such sensor which permits deposition of hard magnetic films and magnetoresistive film elements in physically separated regions of the substrate; the provision of such sensor which permits completion of the magnetic circuit connecting the magnetic biasing fields to the magnetoresistive element by relatively easy to deposit and pattern soft magnetic material; the provision of such sensor which is physically small; and the provision of such which is economically feasible and commercially practical.

Briefly described, a sensor embodying aspects of the invention includes a sensing region and a biasing region spaced apart from each other. The sensor has a magnetoresistive element positioned in the biasing region as well as a magnetic circuit providing a magnetic field to the sensing region and the biasing region. The magnetic circuit is magnetically coupled to the magnetoresistive element so that its magnetic field biases the magnetoresistive element. The sensor also includes a circuit for detecting changes in the magnetic field in the biasing region as a function of changes in the resistance of the magnetoresistive element. In this manner, changes in the magnetic field caused by the presence of a magnetic sample proximate the sensing region are detected.

Another embodiment of the invention is directed to a method of detecting the presence of a magnetic sample proximate a sensing region. The method includes the step of positioning a magnetoresistive element in a biasing region which is spaced apart from the sensing region. The method also includes providing a magnetic field to the sensing region and the biasing region with a magnetic circuit. The magnetic circuit is magnetically coupled to the magnetoresistive element so that its magnetic field biases the magnetoresistive element. The method further includes the step of detecting changes in the magnetic field in the biasing region as a function of changes in the resistance of the magnetoresistive element. In this manner, changes in the magnetic field caused by the presence of a magnetic sample proximate the sensing region are detected.

Other objects and features will be in part apparent and in part pointed out hereinafter.

BRIEF DESCRIPTION OF THE DRAWINGS

Corresponding reference characters indicate corresponding parts through the drawings.

DETAILED DESCRIPTION OF PREFERRED EMBODIMENTS

Figure 1:
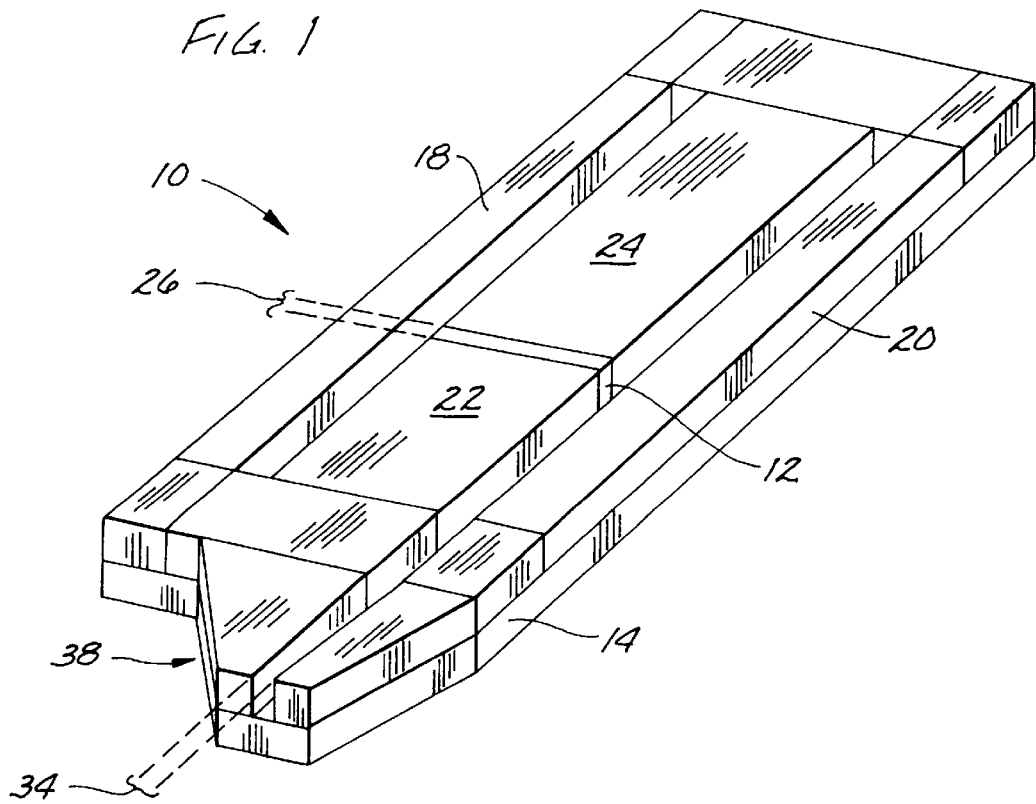
FIG. 1 is a perspective of a magnetic sensor according to a preferred embodiment of the invention.
Figure 2:
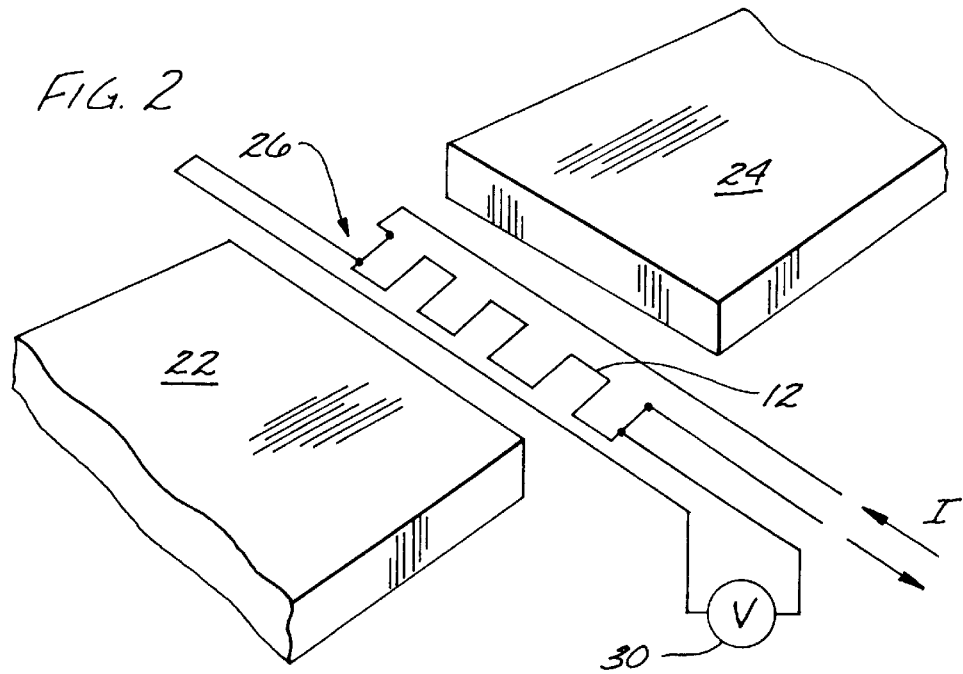
FIG. 2 is an enlarged fragmentary schematic of the sensor of FIG. 1 including a magnetoresistive sensor element.

Referring now to FIG. 1, a thin film sensor according to the present invention, generally indicated at 10, detects magnetic field changes as a function of resistance changes in a magnetoresistive sensor element 12 (see FIG. 2). Preferably, the sensor 10 is built on a substrate 14 by the deposition of thin films of magnetic material. As shown in FIG. 1, sensor 10 includes a first film 18 generally parallel to a second film 20. In a preferred embodiment, the films 18, 20 are thin film strips of a magnetically "hard" material, specifically a permanent magnet, deposited on substrate 14. One advantageous feature of the invention is that the magnetization of both strip 18 and strip 20 are magnetized in the same direction so that both strips 18, 20, or an array of such devices on a chip, can be magnetized simultaneously by the application of a single magnetic field with a large spatial extent compared to the device dimensions.

Thin films 22, 24 of a magnetically "soft" material (e.g., iron, FeCo based alloys, NiFe based films such as permalloy, or other iron based alloys) separate permanent magnet film 18 from permanent magnet film 20. According to one embodiment of the invention, the magnetoresistive sensor element 12 substantially fills a region 26 defined by a gap between the soft magnetic film 22 and the soft magnetic film 24. The permanent magnet films 18, 20 apply a magnetic field which biases the region 26 and, in turn, biases sensor element 12. Magnetically soft iron cobalt alloys, such as $Fe_{0.8}Co_{0.2}$, for films 22, 24 provide for a very high magnetic flux conductance as well as providing enhanced corrosion resistance.

In this embodiment, the soft magnetic films 22, 24, as well as the sensor element 12 which is positioned in biased region 26, conduct magnetic flux between films 18, 20. As such, films 22, 24 constitute a flux conducting region of the sensor 10. The first and second permanent magnet films 18, 20 of sensor 10, in cooperation with the soft magnetic films 22, 24, constitute a magnetic circuit which provides a substantially uniform magnetic field of approximately 0.5 to 2 kOe, for example. It is to be understood that by altering the geometry of sensor 10, larger biasing fields of several kOe, for example, may be obtained.

FIG. 2 schematically illustrates the magnetoresistive sensor element 12 positioned in region 26. In a preferred embodiment of the invention, sensor element 12 is a high field MR material, such as a lanthanum-manganite based material having a relatively large magnetoresistive response, which passes through or fills the gap defining region 26. Element 12 may be generally straight or, as shown in FIG. 2, it may have a serpentine configuration which provides a longer length of MR material in biased region 26.

Different additive elements are used to change the magnetoresistive response as a function of temperature. A common lanthanum-manganite series, $La_{1-x}T_xMnO_3$, where T=Ca, Sr, or Ba, uses these substitute elements to change the temperature region for a large magnetoresistive response. One composition for a large magnetoresistive response has $x \approx 0.3$ (e.g., $La_{0.7}Ca_{0.3}MnO_3$, $La_{0.7}Sr_{0.3}MnO_3$, or $La_{0.7}Ba_{0.3}MnO_3$). The magnetoresistive response of the Ca substituted composition is mainly large for temperatures less than room temperature, while the Sr and Ba substituted compositions have a relatively large magnetoresistive response at the above room temperature. Single crystals and single crystal films exhibit large values of magnetoresistive response only over a narrow temperature range while polycrystalline samples exhibit a somewhat reduced but much broader magnetoresistive response as a function of temperature. In the present embodiment, sensor element 12 is preferably an Sr substituted lanthanum-manganite based material.

When a magnetic field is applied to La-manganite based magnetoresistive materials, a change in resistance occurs primarily as a function of the applied field magnitude. Advantageously, the changes in resistance (or resistivity) are greater using a high field rather than a low field MR material for sensor element 12. For example, Δρ is approximately 5% or more for La-manganite. Other suitable high field MR materials known to those skilled in the art, in addition to La-manganite, may be used without deviating from the scope of the invention. Further, a number of related La-manganite type compositions, each having a different operable temperature region, may be deposited as film layers. For example, the layers may be arranged so that the electrical conduction is from layer to layer or connected as strip segments so that electrical conduction is along one segment to the next (i.e. a series connection). The connected strip segments may also be arranged as a gradient in either the type or the number of substituted atoms along a strip length. The advantage of employing a composite MR material is that even though each individual component layer may have a relatively limited temperature range for a desired magnetoresistive response, the composite structure has a broader range of operable temperatures. Thus, the composite material exhibits a relatively broad temperature response suitable for a desired sensor temperature range of operation, even though no individual layer has a sufficient sensitivity over the desired temperature range by itself.

In a preferred embodiment of the present invention, either a DC or an AC current source (not shown) supplies magnetoresistive sensor element 12 with a substantially constant or known current. Thus, a voltmeter 30, or other suitable device known to those skilled in the art, may be used to measure the resistance changes in element 12. One preferred measurement circuit has four terminal current and voltage leads. As an example, these electrical connections for the current source and for the voltmeter 30 are made by noble metal films using normal integrated circuit methods. In the illustrated embodiment, the adjacent soft magnetic pole pieces (i.e., film 22 on one side of region 26 and film 24 on the other side of region 26) are electrically insulated from sensor element 12. This includes the instance in which films 22, 24 are comprised of an insulating magnetic material, such as ferrite. Thus, current flows generally in the longitudinal direction of region 26.

In the alternative, films 22, 24 are comprised of an electrically conductive magnetic material and function as current leads to the magnetoresistive sensor element 12 positioned in region 26. For example, film 22 is deposited over one edge of sensor element 12 and film 24 is deposited over the opposite edge of sensor element 12 to make the electrical connections. In this instance, an insulating break in one or both of films 22, 24 separates the two so that the magnetic pole pieces act as direct two-terminal connections to the magnetoresistive sensor element 12. In this instance, current flows generally transverse to region 26 rather than in the gap's longitudinal direction.

Figure 3:
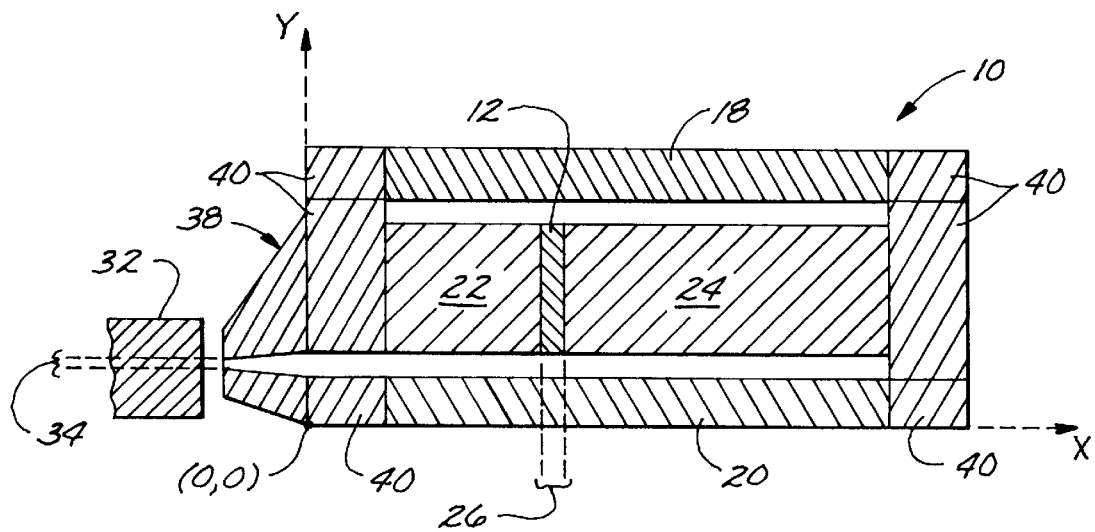
FIG. 3 is a top view of the sensor of FIG. 1.

FIG. 3 is a top view of sensor 10. As shown, permanent magnet films 18, 20 define the sides, or legs, of an H pattern and region 26 defines its cross piece. In this configuration, a single magnetic field application which has a large spatial extent relative to the size of the H pattern may be used to magnetize films 18, 20. Films 18 and 20 are preferably magnetized to obtain the desired bias field either during permanent magnet film deposition or at some later time. In this embodiment, the magnet film 18 (one leg of the H) and the magnet film 20 (the other leg of the H) are magnetized in the same direction such that they provide a substantially uniform magnetic biasing field. As illustrated, regions of non-magnetic material (e.g., air), separate films 18, 20 from films 22, 24.

While conventional magnetoresistive sensing devices require that their magnetoresistive elements be placed in close proximity with a magnetized sample, sensor 10 advantageously permits sensing of a sample 32 of either magnetized or magnetizable material at a separate sensing region 34 which is spaced apart from magnetoresistive sensor element 12 but nonetheless remotely coupled to it. According to the invention, changes in the proximity of the magnetic sample 32 relative to the sensing region 34 provide substantial changes in the field biasing level of the magnetoresistive sensor element 12. A flux directing portion of the magnetic sensor 10, generally indicated at 38, separates the body of sensor 10, including the biased region 26, from the remote sensing region 34. When magnetic sample 32 is in close proximity with the flux directing portion 38 (i.e., within the sensing region 34), it alters the bias in region 34 which causes the bias at region 26 to change which alters the resistance of the magnetoresistive sensor element 12. In a preferred embodiment, sensor 10 also includes films 40 of soft magnetic material (e.g., iron, FeCo based alloys, NiFe based films such as permalloy, or other iron based alloys) deposited on substrate 14.

As an example, magnetic sample 32 is a magnetically hard magnetized ferromagnetic material in the form of a magnetic recording medium (e.g., a tape or disk) or a magnet or a magnetically soft ferromagnetic material (e.g., iron). If magnetic sample 32 is a magnetic recording medium, the magnetic field provided at sensing gap region 34 alters the biasing field at region 26. In turn, the resistance of sensor element 12 changes which allows sensor 10 to "read" the magnetic recording medium. Likewise, if magnetic sample 32 is a piece of iron, the biasing level at region 26 also changes when it nears sensing region 34, resulting in a change in the resistance of element 12. In this instance, sensor 10 detects the presence of magnetic sample 32 in close proximity with sensing region 34 which is particularly useful in position sensing applications. If magnetic sample 32 is a magnet, the maximum Δρ occurs when the portion of sample 32 across sensing region 34 changes from a positive pole to a negative pole, or vice versa.

In a preferred embodiment, the magnetic field provided by permanent magnet films 18, 20 biases magnetoresistive sensor element 12 near the field magnitude which causes the metal-insulator transition. As such, sensor 10 is adapted to provide relatively high magnetoresistive sensitivity for relatively small flux changes in sensing region 34.

Figure 4A:
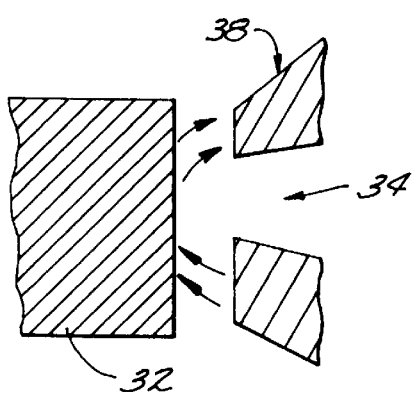
FIGS. 4A and 4B are enlarged fragmentary views of the sensor of FIG. 3.
Figure 4B:
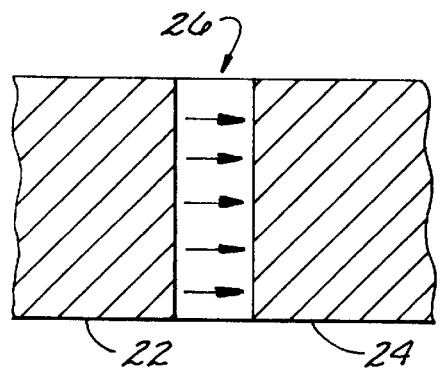

FIG. 4A illustrates exemplary magnetic flux lines in the vicinity of the sensing gap region 34 and FIG. 4B illustrates exemplary magnetic flux lines in the vicinity of the biased gap region 26.

Figure 5:
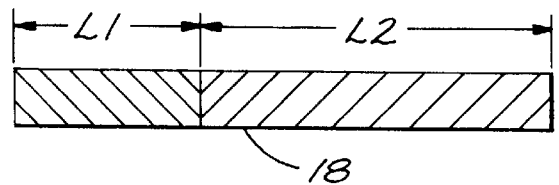
FIG. 5 is a top view of an alternative magnetic circuit for use with the sensor of FIG. 1.

Referring now to FIG. 5, an alternative embodiment of the invention includes soft magnetic material, in addition to hard magnetic material, in at least one of the films 18, 20. For example, film 18 includes a portion of permanent magnet film having a length L1 positioned end-to-end with a portion of soft magnetic film having a length L2. In this embodiment, the relative lengths of the permanent magnet film (L1) and the soft magnetic film (L2) along each leg of the H pattern (i.e., film 18 and/or film 20) determines the overall level of the magnetic biasing field applied to region 26. Thus, the biasing field available at the region 26 containing magnetoresistive sensor element 12 may be varied by varying L1 and L2.

In yet another alternative embodiment, either film 18 or film 20 comprises a soft magnetic material rather than a permanent magnet. It is to be understood that the magnitude of the biasing field applied by filing 18, 20 may be varied by altering the geometry of sensor 10.

Figure 6:
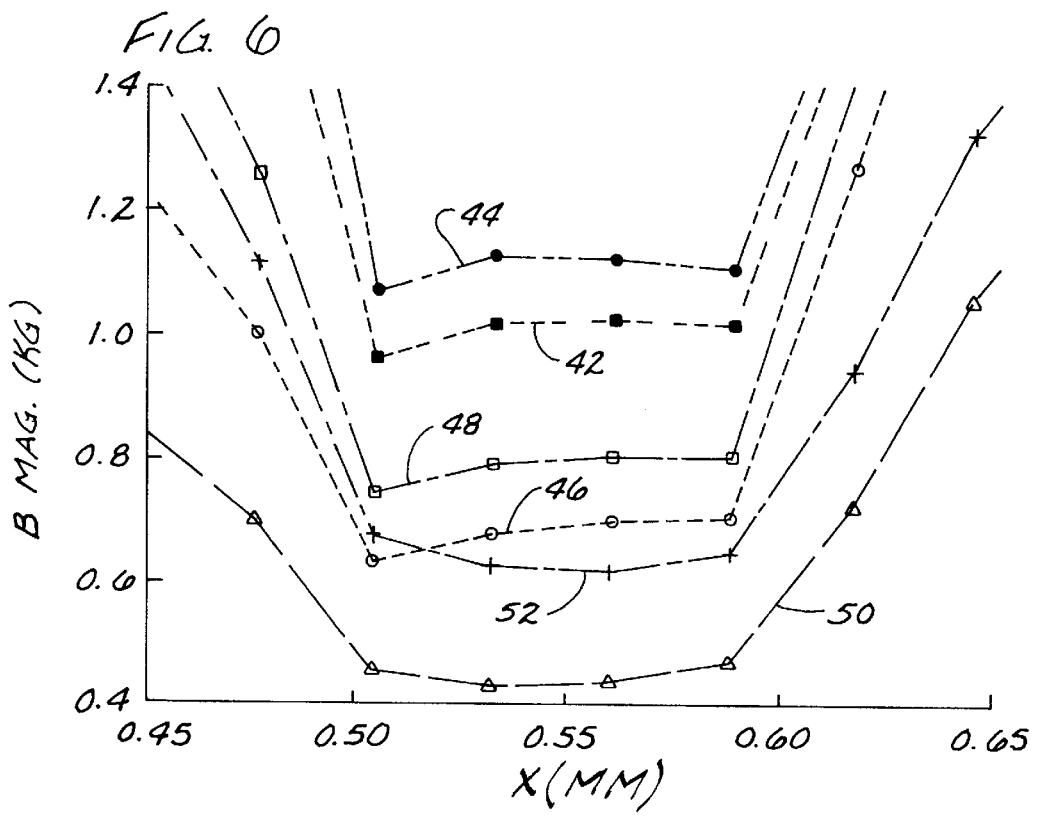
FIG. 6 are exemplary graphs illustrating the ranges of biasing field levels versus x for different values of L1 and L2 for the magnetic circuit of FIG. 5.

FIG. 6 graphically illustrates three exemplary ranges of biasing field levels versus x for different values of L1 and L2 for film 18 (see FIG. 3 illustrating an originating point (0,0) for an (x,y) coordinate system). For these exemplary curves, the gap defining biased region 26 is approximately 0.1 mm wide and is located approximately 0.5 mm from one end of the body of sensor 10 (i.e., x=0.5 to 0.6 mm).

In particular, a pair of curves 42, 44 shown in FIG. 6 illustrate when both legs of the H pattern (i.e., films 18, 20) are permanent magnets of approximately the same length and magnetized in the same direction. In other words, curves 42, 44 show exemplary magnetic field magnitudes when L2 is zero. As shown in curve 42, the field intensity at the biased region 26 with the sensing region 34 open is approximately 1000 gauss (G), or 1.0 kG. In contrast, the field intensity at the biased region 26 with a soft magnetic material close to the sensing region 34 is approximately 1200 G, or 1.2 kG, as shown in curve 44. Thus, the magnetic field applied to sensor element 12 in biased region 26 increases by 0.2 kG when sample 32 is proximate sensing region 34.

In another instance, a pair of curves 46, 48 illustrate when one of the legs of the H pattern (e.g., film 20) is a permanent magnet material and the other of the legs of the H pattern (e.g., film 18) is about one-third soft magnetic material and about two-thirds permanent magnet material. In other words, curves 46, 48 show exemplary magnetic field magnitudes when L1 is twice L2. As shown in curve 46, the field intensity at the biased region 26 with the sensing region 34 open is approximately 0.68 kG. In contrast, the field intensity at the biased region 26 with a soft magnetic material proximate sensing region 34 is approximately 0.80 kG, as shown in curve 48.

FIG. 6 also illustrates a pair of curves 50, 52 corresponding to when one of the legs of the H pattern (e.g., film 20) is a permanent magnet material and the other of the legs of the H pattern (e.g., film 18) is a soft magnetic material. In other words, curves 50, 52 show exemplary magnetic field magnitudes when L1 is zero. In this instance, the magnetic circuit providing the biasing magnetic field consists of film 20. As shown in curve 50, the field intensity at the biased region 26 with the sensing region 34 open is approximately 0.40 kG. In contrast, the field intensity at the biased region 26 with a soft magnetic material proximate sensing region 34 is approximately 0.65 kG, as shown in curve 52.

Figure 7:
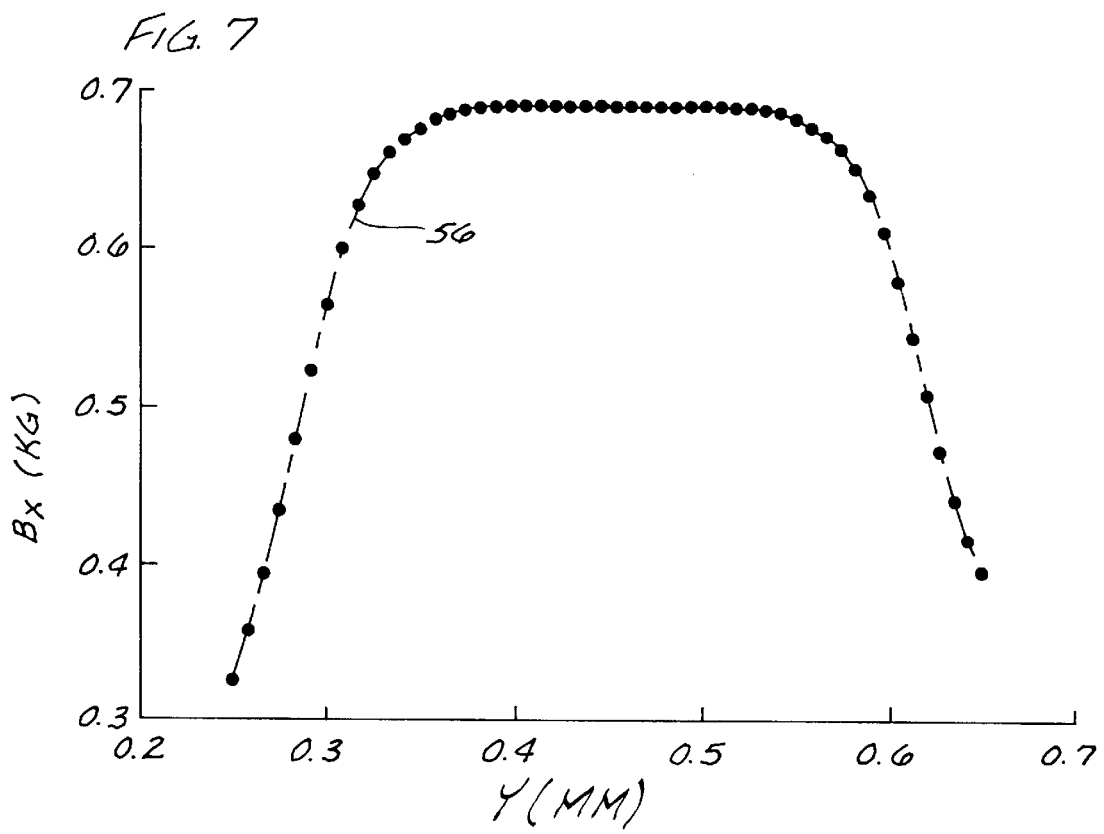
FIG. 7 is an exemplary graph illustrating the magnetic field magnitude along a biased region of the sensor of FIG. 1.

FIG. 7 illustrates the variation of the magnetic field magnitude along the longitudinal axis of biased region 26. In this example, the gap between film 22 and file 24 defines the biased region 26 in the y direction to be from 0.3 mm to 0.6 mm. Further, film 18 is about one-third soft magnetic material and about two-thirds permanent magnet material whereas film 20 is a permanent magnet material. As an exemplary curve 56 illustrates, the magnetoresistive sensor element 12 which fills region 26 aids in conducting magnetic flux between films 18, 20 and the magnetic field is substantially uniform along the entire length of region 26.

As described above, sensor 10 comprises hard and soft magnetic films (i.e., films 18, 20, 22, 24) and a magnetoresistive film (i.e., sensor element 12), all of which are preferably constructed on substrate 14 by film deposition processes. One preferred method for constructing sensor 10 includes fabrication by La-manganite thin film deposition and permanent magnet thin film deposition processes. Since magnetoresistive sensor element 12 is spaced apart from films 18, 20, the La-manganite film of sensor element 12 need not be deposited onto or in conjunction with the biasing magnetic films 18, 20. As an example, substrate 14 is adapted for La-manganite film deposition by sputtering, laser ablation, metal oxide chemical vapor deposition or any other suitable method. Generally, boundary layers for permanent magnet film deposition relieve stresses so that compatibility between substrate 14 and the permanent magnet material of films 18, 20 is not a problem. The fabrication of La-manganite films, hard magnetic films and soft magnetic films, as well as the deposition of such films on a substrate, is known to those skilled in the art.

Soft magnetic material which is relatively easy to deposit and pattern completes the magnetic circuit connecting the magnetic biasing field to sensor element 12. By using thin films of magnetic materials, the entire structure of sensor 10 may be constructed to be physically small (e.g., approximately 1 by 2 or smaller) yet still provide approximately biasing magnetic fields of approximately 1 kG or more. Although the illustrated embodiment of sensor 10 is described with respect to thin films so that it may be kept small, it is to be understood that alternative embodiments may use magnetic materials other than thin films without deviating from the scope of the invention.

Preferably, a process such as simple film patterning may be used to adjust the film thickness and width of either the hard or soft magnetic flux paths to adjust the biasing field applied to region 26 to provide the desired magnetoresistive sensitivity. The present invention, in which the biasing magnetic films 18, 20 are physically separated from the biased region 26, is particularly well suited for such adjustments. In practice, a certain width of magnetic film may be deposited and then reduced by photolithography patterning, for example, to obtain the proper biasing field. Since magnetoresistive sensor element 12 and biasing magnetic films 18, 20 occupy separate planar regions on substrate 14, the La-manganite film's magnetoresistive properties remain unchanged and predictable in the presence of the biasing field.

Further, by separating biased region 26 from sensing region 34, the La-manganite sensor element 12 may be maintained within a relatively narrow temperature range for optimum magnetoresistive response even though the temperature at sensing region 34 is outside the range. Thin film temperature control techniques, including the use of heater films, control circuits and oven enclosures, are known to those skilled in the art for controlling the temperature of the La-manganite magnetoresistive sensor element 12.

Further, by separating biased region 26 from sensing region 34, the magnetoresistive response of La-manganite sensor element 12 may be temperature compensated by using a separate thermometer strip which responds to temperature changes, but not magnetic field changes, such as a carbon glass thermometer strip in proximity to the La-manganite strip. The magnetoresistive response of the La-manganite sensor element 12 may be extracted from resistance changes due to temperature and magnetic changes since the temperature change is known from the adjacent magnetic field independent thermometer strip. This would also include the case where the functional temperature dependence of the La-manganite based sensor and the thermometer strip are similar so that the magnetoresistive response can be made to appear as a difference signal. Various modes of temperature compensation and signal extraction are known to those skilled in the art.

A number of different permanent magnet film materials may be used depending upon the overall physical size of sensor 10 and the strength of the magnetic fields required to achieve biasing to high magnetoresistive sensitivity. For example, an isotropic permanent magnet film may be used to provide a relatively wide film region. Such a film may be deposited by making initially amorphous depositions of either several Sm-Co alloy compositions or Nd-Fe-B mixes. The initially amorphous films are then subsequently crystallized. The remanent flux in this case is only half the saturation value effecting optimal device miniaturization. Generally, film substrate boundary layers promote adhesion for films with thicknesses greater than 12 μm but may also be used with thinner layers. The magnetic energy density of such isotropic films is approximately 6 MGOe.

The area of the permanent magnet film required to achieve proper biasing field levels may be reduced by using anisotropic permanent magnet films exhibiting in-plane anisotropy. Such films are deposited at somewhat elevated temperatures (e.g., 350 to 500° C.), but still at temperatures lower than La-manganite deposition temperatures. In this instance, energy products of 16–18 MGOe may be deposited using Sm-Co based films crystallized into the $TbCu_7$ crystal structure. Thus, the spatial area of the permanent magnet film region may be greatly reduced while still achieving the same magnetic field biasing levels.

Integrated Software Engineering provides a three-dimensional modeling software, Amperes, which is suitable for modeling sensor 10 to determine the desired widths and thickness of the various elements. For example, the permanent magnet material may be modeled as appropriate to Sm-Co based material with a remanent flux density of 10 kG and an intrinsic coercive force of 8 kOe. The soft magnetic material may be modeled as iron having a possible saturation flux density of 18 kG. Each permanent magnet film 18, 20 is approximately 100 μm thick and the soft iron films used for defining biased region 26 and sensing region 34 are also approximately 100 μm thick. It is to be understood that a desired biasing field magnitude may be achieved by varying the actual film width and thickness.

Figure 8:
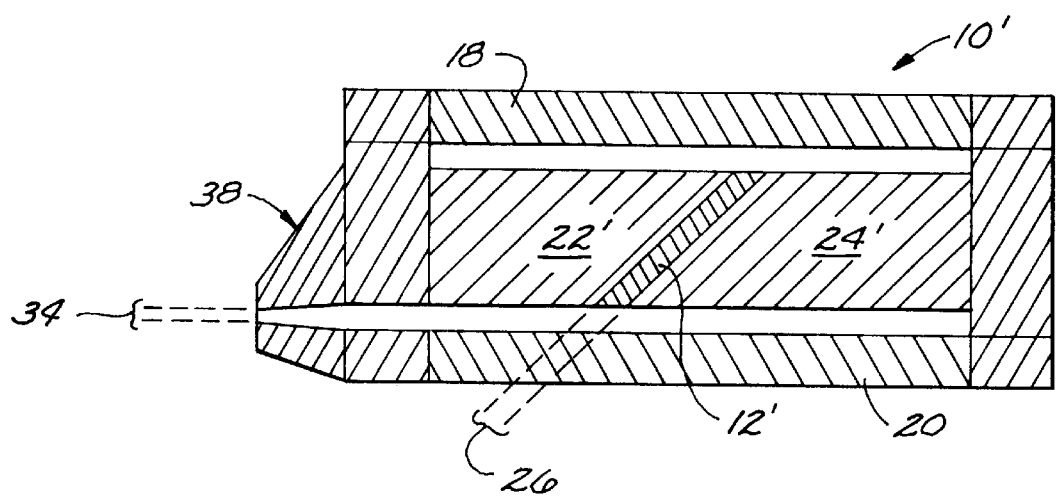
FIG. 8 is a top view of a magnetic sensor according to another preferred embodiment of the invention.

Although the invention is generally for use with a high field MR material such as La-manganite based materials, it is contemplated that films 18, 20 may also be used for biasing other MR materials (e.g., permalloys or multilayered film magnetic structures and granular film materials exhibiting magnetoresistive properties) without deviating from the scope of the invention. FIG. 8 illustrates an alternative embodiment of a magnetoresistive sensor, generally indicated at 10', employing a magnetoresistive sensor element 12' of permalloy, for example.

FIG. 8 is a top view of the sensor 10' according to this alternative embodiment. As shown, soft magnetic thin films 22', 24' separate permanent magnet film 18 from permanent magnet film 20. The magnetoresistive sensor element 12' substantially fills a region 26' defined by a gap between the soft magnetic film 22' and the soft magnetic film 24' . As before, the permanent magnet films 18, 20 apply a magnetic field which biases the region 26' and, in turn, biases sensor element 12'. As described above, biased region 26 in one embodiment is generally perpendicular to films 18, 20. In the embodiment of FIG. 8, however, region 26' is positioned at an angle relative to the two biasing films 18, 20. In other words, the magnetic field across the biased region 26' is at an angle with respect to the current in magnetoresistive element 12'. This alternative embodiment is particularly useful when magnetoresistive sensor element 12' is a low field MR material, such as permalloy, which exhibits a change in resistivity as a function of the angle between the magnetic field and current directions. For example, region 26' forms a 45° angle with respect to film 18 and film 20.

In addition to magnetic recording applications, sensor 10 is also particularly well suited for other types of magnetic sensing including position and rotation sensing. In addition, sensor 10 is useful in ink-jet technology, or electroplating, or other deposition processes. For example, sensor 10 may be used to read a pattern of high permeability dots containing a powder of magnetizable material (e.g., permalloy) which have been deposited to create an encoded pattern. This pattern may take the form of a bar code or other dot pattern which is then read by measuring the magnetoresistive effect of sensor 10. In this instance, the bar or dot pattern need not be magnetized in any specific manner since the read operation of sensor 10 is responsive to the presence of magnetizable material and not just magnetized material. Yet another use for the present invention is as a viable memory media due to the small size of sensor 10.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A sensor for detecting the presence of a magnetic sample, said sensor comprising:

a sensing region;

a biasing region spaced apart from the sensing region;

a magnetoresistive element positioned in the biasing region, said mapgnetoresistive element having a resistance that changes as a function of magnetic field changes;

a flux directing region of magnetic material adjacent the sensing region for magnetically coupling the sensing region to the biasing region;

a magnetic circuit providing a substantially uniform magnetic field to the sensing region and to the biasing region, said magnetic circuit comprising first and second strips of magnetic material positioned generally parallel to each other on opposite sides of the biasing region, said first and second strips of magnetic material being magnetized in the same direction by application of an external magnetic field, said magnetic circuit being magnetically coupled to the magnetoresistive element positioned in the biasing region so that the magnetic field provided by the magnetic circuit biases the magnetoresistive element; and a circuit for detecting changes in the magnetic field in the biasing region as a function of changes in the resistance of the magnetoresistive element whereby changes in the magnetic field in the biasing region caused by the presence of the magnetic sample proximate the sensing region are detected.

2. The sensor of claim 1 wherein the first strip of magnetic material includes a portion of magnetically hard material.

3. The sensor of claim 2 wherein the second strip of magnetic material includes a portion of magnetically hard material.

4. The sensor of claim 3 wherein the second strip of magnetic material includes a portion of magnetically soft material adjacent the portion of magnetically hard material.

5. The sensor of claim 4 wherein the magnitude of the magnetic field provided by the magnetic circuit is a function of the length of the portion of magnetically hard material relative to the length of the adjacent portion of magnetically soft material of the second strip of magnetic material.

6. The sensor of claim 1 further comprising a flux conducting region of magnetically soft material positioned between the first and second strips of magnetic material to provide a flux path therebetween.

7. The sensor of claim 6 wherein the flux conducting region includes first and second portions of magnetically soft material having a gap therebetween which defines the biasing region, said magnetoresistive element being positioned in the gap.

8. The sensor of claim 1 wherein the magnetoresistive element is positioned generally transverse to the first and second strips of magnetic material.

9. The sensor of claim 1 further comprising a substrate and wherein the magnetoresistive element and the magnetic circuit comprise thin films deposited on the substrate.

10. The sensor of claim 1 wherein the magnetoresistive element comprises a thin film of lanthanum-manganite based material.

11. The sensor of claim 10 wherein the thin film of lanthanum-manganite based material has one or more substituted elements for modifying its magnetoresistive response.

12. The sensor of claim 1 wherein the magnetic field provided to the magnetoresistive element by the magnetic circuit has a magnitude less than a threshold level for biasing the magnetoresistive element and wherein the resistance of the magnetoresistive element changes when the magnitude of the magnetic field provided thereto exceeds the threshold level.

13. A method of detecting the presence of a magnetic sample proximate a sensing region, said method comprising the steps of:

positioning a magnetoresistive element in a biasing region spaced apart from the sensing region, said magnetoresistive element having a resistance that changes as a function of magnetic field changes;

magnetically coupling the sensing region to the biasing region with a flux directing region of magnetic material adjacent the sensing region;

positioning first and second strips of magnetic material generally parallel to each other on opposite sides of the biasing region to form a magnetic circuit;

applying an external magnetic field to the magnetic circuit to magnetize the first and second strips of magnetic material in the same direction;

providing a substantially uniform magnetic field to the sensing region and the biasing region with the magnetic circuit, said magnetic circuit being magnetically coupled to the magnetoresistive element positioned in the biasing region so that the magnetic field provided by the magnetic circuit biases the magnetoresistive element; and detecting changes in the magnetic field in the biasing region as a function of changes in the resistance of the magnetoresistive element whereby changes in the magnetic field in the biasing region caused by the presence of the magnetic sample proximate the sensing region are detected.

14. The method of claim 13 wherein the first strip of magnetic material includes a portion of magnetically hard material.

15. The method of claim 14 wherein the second strip of magnetic material includes a portion of magnetically hard material.

16. The method of claim 15 wherein the second strip of magnetic material includes a portion of magnetically soft material adjacent the portion of magnetically hard material.

17. The method of claim 16 further comprising the step of adjusting the length of the portion of magnetically hard material relative to the length of the adjacent portion of magnetically soft material of the second strip of magnetic material to determine the magnitude of the magnetic field provided by the magnetic circuit.

18. The method of claim 13 further comprising the step of positioning a flux conducting region of magnetically soft material between the first and second strips of magnetic material to provide a flux path therebetween.

19. The method of claim 18 wherein the flux conducting region includes first and second portions of magnetically soft material having a gap therebetween which defines the biasing region and wherein the step of positioning the magnetoresistive element in the biasing region includes positioning the magnetoresistive element in the gap between the first and second portions of magnetically soft material of the flux conducting region.

20. The method of claim 13 wherein the step of positioning the magnetoresistive element includes positioning the magnetoresistive element generally transverse to the first and second strips of magnetic material.

21. The method of claim 13 further comprising the step of depositing thin films of magnetic material on a substrate to form the magnetoresistive element and the magnetic circuit.

22. The method of claim 21 wherein the magnetoresistive element comprises a thin film of lanthanum-manganite based material deposited on the substrate.

23. The method of claim 13 wherein the step of biasing the magnetoresistive element includes providing the magnetic field to the magnetoresistive element at a magnitude less than a threshold level and wherein the resistance of the magnetoresistive element changes when the magnitude of the magnetic field provided thereto exceeds the threshold level.

24. The method of claim 13 further comprising the step of controlling the temperature of the magnetoresistive element to maintain the temperature of the magnetoresistive element within a desired temperature range substantially independent of the temperature of the sensing region.

25. The method of claim 13 wherein the step of detecting changes in the magnetic field includes compensating for the temperature of the magnetoresistive element.

* * * * *